Feb. 14, 1967 A. C. LAWSON 3,304,468
REPLACEABLE ELECTRONIC MODULE FOR MASTER CIRCUIT BOARDS
Filed May 5, 1965
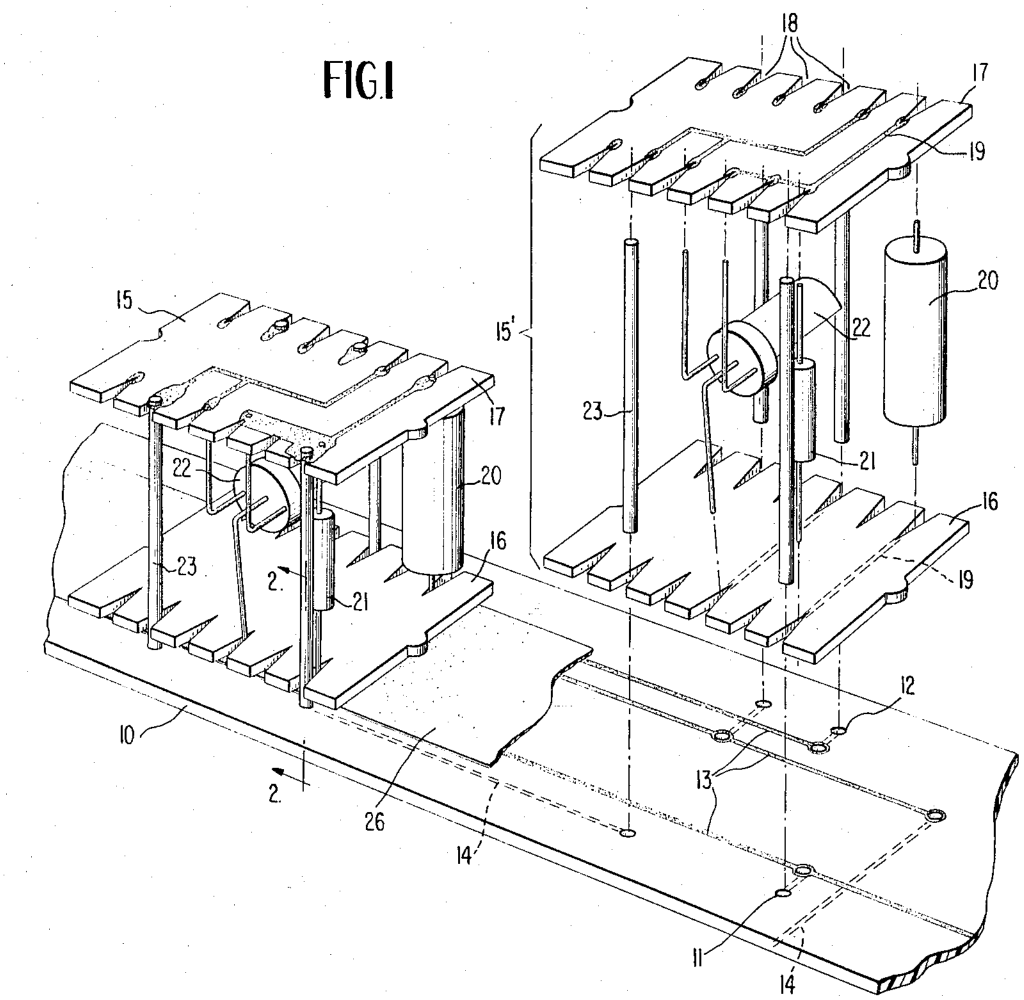
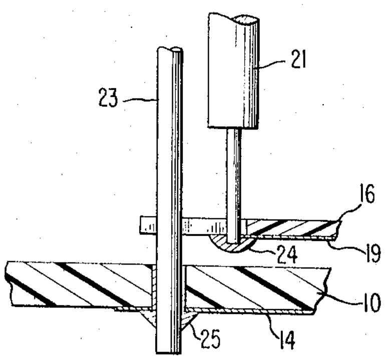
FIG. 2
INVENTOR
ALFRED C. LAWSON
BY Richard E. Hosley
ATTORNEY 3,304,468

REPLACEABLE ELECTRONIC MODULE FOR MASTER CIRCUIT BOARDS

Alfred C. Lawson, Peabody, Mass., assignor to General Electric Company, a corporation of New York Filed May 5, 1965, Ser. No. 453,460
8 Claims. (Cl. 317—101)

This invention generally relates to electronic circuit modules adapted to be used with a master circuit board. More particularly, this invention is directed to a mounting means which permits easy removal of such modules from the master circuit board if desired.

Electronic circuit modules, as known in the prior art, frequently comprise spaced, nonconducting wafers having conductive surfaces formed thereon and a plurality of electrical components connected therebetween. These modules can be affixed to a master circuit board which interconnects such modules mounted on the same master circuit board. Normally, the electrical components which form a part of the circuit module are soldered to the conductive surfaces on the wafers; and risers, connectors or other means are also fixedly attached to the wafers, and these means are then soldered to the master circuit board to complete the connection between the circuit module and the master circuit board.

When a failure occurs in such an assembly, it is usually necessary to remove only the defective circuit module. However, prior art connection techniques require special soldering equipment to heat all the solder connections between a single circuit module and the master printed circuit board simultaneously in order to effect removal of the module. In addition to posing a possible threat of component damage caused by a transfer of heat, a greater hazard exists because excessive heat can raise conductive surfaces formed on circuit boards. If the raised conductive surface is on the master circuit board, the entire master circuit board must normally be replaced in order to insure circuit reliability.

It is therefore an object of this invention to provide a circuit module which is easily removed from the master circuit board.

It is another object of this invention to provide circuit modules which can be removed from a master circuit board without unsoldering the connections to the master circuit board and without applying excessive heat to the conductive surfaces thereon.

Briefly stated, according to this invention a plurality of connector posts are employed to affix a circuit module to a master circuit board. Each connector post is fixed, as by soldering, to a conductive surface on one wafer and is mechanically held to another wafer. No such fixed connection exists between the connector posts and conductive surfaces on the one wafer, and the connector posts extend beyond the one wafer to pass through holes in the master circuit board. Assembly of the circuit module to the master circuit board is completed by fixing, as by soldering, the connector posts to the conductive surfaces on the master circuit board. If a circuit module, connected to a master circuit board in this manner, becomes defective, it can be removed easily by individually heating the connections between the connector posts and conductive surfaces on the other wafer if such connections are solder connections. Then the defective module can be lifted from the board as the only fixed connection between the module and master circuit board has been removed.

The novel features which are characteristic of this invention are set forth with particularity in the appended claims. The invention itself, however, as to its organization, together with further objects and advantages, may be understood by reference to the following description of a circuit module and its associated master circuit board taken in conjunction with the accompanying drawings and description.

FIGURE 1 illustrates a master circuit board having a first circuit module mounted thereon and a second circuit module shown in an exploded view.

FIGURE 2 is a fragmentary view of the construction shown in FIGURE 1 taken along the section line 2—2 looking in the direction of the arrows which illustrates certain details of the module and master circuit board.

Referring to FIGURE 1, a master circuit board 10 which can effectively utilize modules incorporating this invention has a plurality of rows of holes 11 and 12. These holes are selectively interconnected by conductive surfaces 13 and 14 formed on both surfaces of the master circuit board 10.

A first circuit module 15 is shown mounted on the master circuit board 10; and, in an exploded view, another circuit module 15' comprises nonconducting wafers 16 and 17. Each wafer has a plurality of notches 18 formed in opposite sides thereof, and conductive coatings 19 selectively extend between at least some of the notches 18 to form circuit connections. The wafers 16 and 17 are spaced apart in a parallel manner, and a plurality of electronic components can be connected therebetween. For example, the components can comprise a tubular capacitor 20, a resistor 21, a transistor 22 or any other circuit element. Each component has terminal portions which are mechanically placed in proper notches as determined by the circuit to be constructed. As the terminals are inserted into the notches 18, a mechanical wedging action occurs; and the terminals are thereby trapped in the notches 18.

After the electronic components to be utilized with a circuit module are inserted between the notches 18, the terminal portions of the components are secured to the conductive coatings 19 on the first wafer 16 by hand soldering, dip soldering, wave soldering or any other appropriate securing technique. When the securing process has been completed, a plurality of connector posts 23 are placed in at least some of the notches 18, the exact location determined by the particular circuitry involved. The connector posts 23 have a larger diameter than the electronic component terminal portions. If such a connector post is placed in the same notch as contains an electrical component, as in the case of the resistor 21 and the connector post 23 shown in FIGURE 2, the terminal portion of such a component will be spaced from the connector post 23 after the post has been completely wedged in the notch. When the connector post is properly located, it extends slightly beyond the second wafer 17 and extends beyond the first wafer 16. The second wafer 17 is then subjected to a similar process as described earlier whereby the terminals of the electrical components and the connector posts 23 are secured to the conductive coatings 19 on the second wafer 17.

The resulting circuit module 15 has a plurality of connector posts 23 extending beyond a first wafer 16 while not being soldered to any portion thereof. As specifically shown in FIGURE 2, a terminal portion of the resistor 21 is secured to the first wafer 16 by a securing means, such as solder 24. However, no such means secures the connector posts 23 to the first wafer 16. Referring again to FIGURE 1, this wafer can then be placed on the master circuit board 10 by inserting the various connector posts 23 into the holes in the rows 11 and 12. After all the circuit modules to be formed on the master printed circuit board are located, the connector posts 23 can be secured as by soldering to the conductive surfaces 14 on the master circuit board 10 by a similar means as described above, such a solder connection being specifically shown at 25 in FIGURE 2.

Some means must be used to insulate the electrical joints on the first wafer 16 from the conductive coatings 13 formed on the master circuit board 10. Referring to FIGURE 1, an insulating strip 26, affixed to the master circuit board 10, is used to cover the conductive coatings 13 although it does not cover the rows of holes 11 and 12. Other insulating means are also apparent. A second means can comprise strips of insulating tape affixed to the first wafer 16 to cover the connections formed thereon. In another method either formed sheets of insulating plastic having holes therethrough in registration with those in the rows of holes 11 and 12 are affixed to the master circuit board 10 or formed strips of insulating plastic are affixed to the first wafer 16. Still another insulating method could be effected by spacing the first wafer 16 from the master circuit board 10 so that air serves as the insulating medium.

If such a circuit module 15 incorporating this construction fails, it can be removed easily. First, each solder joint between one of the connector posts 23 and one of the conductive surfaces 19 on the second wafer 17 is heated individually. As the solder softens, the connector post 23 can be bent away from the second wafer 17 by pliers or any other means, thereby effectively breaking the solder joint. After each connector post 23 has been heated and bent away from the second wafer 17, the defective circuit module 15 can be lifted from the master circuit board 10 because there is no solder connection between any connector post 23 and the first wafer 16. The defective circuit module 15 can then be placed by at least two alternative methods.

In a preferred method, a new circuit module 15, without connector posts attached thereto, is located on the master circuit board 10. The connector posts 23, which remains attached to the master circuit board 10 by securing means such as solder 25, are returned to their original positions so that they are engaged by some of the notches 18 on the wafers 16 and 17. Each connector post 23 is then individually soldered to conductive coatings 19 on the second wafer 17 to complete the replacement. As no heat is applied directly to the conductive surfaces 14 on the master circuit board 10, heat damage to the master circuit board 10 is substantially eliminated. Further, this preferred method permits replacement without working on the bottom side of the master circuit board 10.

The possibility of heat damage to the master circuit board can also be greatly reduced if a second, alternative replacement method is used. First, each of the connector posts 23 is individually removed from the master circuit board 10. Then a new module 15 with connector posts 23 affixed thereto is substituted for the defective module. The new connector posts 23 are then secured to the master circuit board 10 to complete the replacement.

While the present invention has been described with reference to a particular embodiment thereof and a particular method of construction, various modifications may be made by those skilled in the art without actually departing from the spirit and scope of the invention. Such anticipated modifications might include other soldering methods and different circuit arrangements. Therefore, the appended claims are intended to cover all such equivalent variations as come within the true spirit and scope of the invention.

What I claim as new and desire to secure by Letters Patent of the United States is:

1. A circuit module adapted for mounting on a circuit board comprising:

(a) first and second spaced, parallel circuit wafers, each circuit wafer having means formed thereon to trap a conductor and conductive means formed on each of said wafers;

(b) a plurality of electrical components disposed between said circuit wafers with terminal portions of each of said electrical components held by said trapping means;

(c) a plurality of connector posts partially disposed between said circuit wafers and in said trapping means, each of said connector posts having a first end portion extending beyond said first circuit wafer and constituting the sole means for connecting said module to the circuit board and a second end portion terminating adjacent said second circuit wafer;

(d) means connecting only those terminal portions held by said trapping means formed on said first circuit wafer to said conductive means thereon; and (e) means connecting said terminal portions and said connector post second end portions to said conductive means formed on said second circuit wafer, only said connector post second end portion being permanently connected to said circuit module.

2. A circuit module adapted for mounting on a circuit board comprising:

(a) first and second spaced, parallel circuit wafers, each of said circuit wafers having a plurality of notches formed therein and conductive coatings disposed on said wafers between at least some of said notches;

(b) a plurality of electrical components disposed between said circuit wafers with terminal portions of each of said electrical components pressed into one of said notches;

(c) a plurality of connector posts partially disposed between said circuit wafers and in said notches, each connector post having a first end portion extending beyond said first circuit wafer and constituting the sole means for connecting said module to the circuit board and a second end portion terminating adjacent said second circuit wafer;

(d) solder connecting only said terminal portions pressed into said notches on said first circuit wafer to said conductive coatings thereon; and (e) solder connecting said terminal portions and said connector post second end portions to at least some of said conductive coatings formed on said second circuit wafer, only said connector post second end portion being soldered to said circuit module.

3. In combination:

(a) a circuit module comprising:

(1) first and second spaced, parallel circuit wafers, each circuit wafer having means formed thereon to trap a conductor and conductive means formed on each of said wafers;

(2) a plurality of electrical components disposed between said circuit wafers with terminal portions of each of said electrical components held by said trapping means;

(3) a plurality of connector posts partially disposed between said circuit wafers and in said trapping means, each of said connector posts having a first end portion extending beyond said first circuit wafer and a second end portion terminating adjacent said second circuit wafer;

(4) means connecting only those terminal portions held by said trapping means formed on said first circuit wafer to said conductive means thereon; and (5) means connecting said terminal portions and said connector post second end portions to said conductive means formed on said second circuit wafer, only said connector post second end portions being permanently connected to said circuit module;

(b) a circuit board having holes therethrough and conductive coatings selectively disposed thereon, said connector post first end portions on said module passing through said holes and being the sole connecting means to said circuit board; and (c) means connecting said connector post first end portions only to said conductive coatings on said circuit board whereby said circuit module is connected to said circuit board.

4. The combination as recited in claim 3 wherein a plurality of circuit modules are mounted on said circuit board.

5. The combination as recited in claim 3 wherein insulating means are disposed between said circuit module and said circuit board.

6. In combination:

(a) a circuit module comprising:

(1) first and second spaced, parallel circuit wafers, each of said circuit wafers having a plurality of notches formed therein and conductive coatings disposed on said wafers between at least some of said notches;

(2) a plurality of electrical components disposed between said printed circuit boards with terminal portions of each of said electrical components pressed into one of said notches;

(3) a plurality of connector posts partially disposed between said circuit wafers and in said notches, each connector post having a first end portion extending beyond said first circuit wafer and a second end portion terminating at said second circuit wafer;

(4) solder connecting only said terminal portions pressed into said notches on said first circuit wafer to said conductive coatings thereon; and (5) solder connecting said terminal portions and said connector post second end portions to at least some of said conductive coatings formed on said second circuit wafer, only said connector post second end portions being electrically connected to said circuit module;

(b) a circuit board having holes therethrough and conductive coatings selectively disposed thereon, said connector post first end portions on said module passing through said holes and being the sole connecting means to said circuit board; and (c) solder connecting said connector post first end portions only to said conductive coatings on said circuit board whereby said circuit module is connected to said circuit board.

7. A method for assembling a circuit module adapted to be used in conjunction with a plurality of such circuit modules and a master circuit board, each module including first and second spaced, parallel circuit wafers, the first and second printed circuit wafers each having a plurality of trapping means formed therein and a plurality of electrical components disposed therebetween with the terminals of said components held by said trapping means, comprising:

(a) securing the terminals held by the trapping means in the first circuit wafer thereto;

(b) locating a plurality of conductor posts in the trapping means with a first end portion of each post extending beyond the first circuit wafer for insertion into holes formed on the master circuit board, and a second end portion terminating adjacent the second circuit wafer;

(c) securing the terminals and connector posts in the trapping means formed on the second circuit wafer;

(d) inserting only the first end portion of each conductor post on the module through the holes in the master circuit board; and (e) securing the connector post first end portions only to conductive coatings formed on the master circuit board.

8. A method for assembling a circuit module adapted to be used in conjunction with a plurality of such circuit modules and a master circuit board, each module including first and second spaced, parallel circuit wafers, each circuit wafer having a plurality of notches formed therein and a plurality of electrical components disposed between said first and second circuit wafers with the component terminals pressed into the notches, comprising:

(a) soldering the terminals in the notches of the first circuit wafer to conductive coatings thereon;

(b) locating a plurality of conductor posts in said notches with a first end portion of each post extending beyond the first circuit wafer for insertion into holes formed in the master circuit board, and with a connector post second end portion terminating adjacent the second circuit wafer;

(c) soldering the terminals and connector posts in notches in the second circuit wafer to conductive coatings thereon;

(d) inserting only the connector post first end portion of each conductor post on the module through the holes in the master circuit board; and (e) soldering the connector post first end portions only to conductive coatings on the master circuit board to thereby connect the circuit modules to the master circuit board.

References Cited by the Examiner

FOREIGN PATENTS 1,275,263 9/1961 France.

OTHER REFERENCES

Electronic Equipment Engineering, June 1962, pp. 17, 18.

ROBERT K. SCHAEFER, *Primary Examiner.*

W. C. GARVERT, *Assistant Examiner.*